(12) United States Patent
Choi

(10) Patent No.: US 8,520,435 B2
(45) Date of Patent: Aug. 27, 2013

(54) NONVOLATILE MEMORY DEVICE AND METHOD OF OPERATING THE SAME

(75) Inventor: Jea Won Choi, Chungcheongnam-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 227 days.

(21) Appl. No.: 13/182,819

(22) Filed: Jul. 14, 2011

(65) Prior Publication Data

US 2012/0099375 A1    Apr. 26, 2012

(30) Foreign Application Priority Data

Oct. 26, 2010   (KR) ........................ 10-2010-0104852

(51) Int. Cl.
G11C 11/34   (2006.01)
(52) U.S. Cl.
USPC ................................ 365/185.11; 365/185.22
(58) Field of Classification Search
USPC ........................................ 365/185.11, 185.22
See application file for complete search history.

(56) References Cited

U.S. PATENT DOCUMENTS 7,760,552 B2 * 7/2010 Miyake et al. ........... 365/185.22

FOREIGN PATENT DOCUMENTS

KR    1020100056860    5/2010

OTHER PUBLICATIONS

Office Action issued by the Korean Intellectual Property Office on Jan. 18, 2012.

* cited by examiner

*Primary Examiner* — Son Dinh
*Assistant Examiner* — Nam Nguyen
(74) *Attorney, Agent, or Firm* — IP & T Group LLP

(57) ABSTRACT

A method of operating a nonvolatile memory device includes performing a first program loop, including a first program operation and a first program verification operation, for memory cells of a first page, counting a number of times that the first program loop is performed and storing the counted number when a memory cell having a threshold voltage higher than a first verification voltage, among the memory cells of the first page, is detected, and performing a second program loop, including a second program operation and a second program verification operation, for memory cells of a second page in response to the stored number for the first program loop.

25 Claims, 7 Drawing Sheets

FIG. 2A

PGM
MPV1
PGM
MPV1
PGM
MPV1
PGM
MPV1
MPV2
PGM
MPV1
MPV2
PGM
MPV1
MPV2
PGM
MPV1
MPV2
MPV3
PGM
MPV1
MPV2
MPV3
PGM
MPV1
MPV2
MPV3
PGM
MPV1
MPV2
MPV3
PGM
MPV1
MPV2
MPV3
PGM
MPV1
MPV2
MPV3

NONVOLATILE MEMORY DEVICE AND METHOD OF OPERATING THE SAME

CROSS-REFERENCE TO RELATED APPLICATION

Priority to Korean patent application number 10-2010-0104852 filed on Oct. 26, 2010, the entire disclosure of which is incorporated by reference herein, is claimed.

BACKGROUND

Exemplary embodiments relate to a nonvolatile memory device and a method of operating the same.

There is an increasing demand for nonvolatile memory devices which can be electrically programmed and erased without the refresh function of rewriting data at specific intervals.

The nonvolatile memory device can be electrically programmed and erased by shifting threshold voltages of memory cells where electrons within the memory cell, e.g., an oxide layer, are moved by an electric field applied to the oxide layer.

In order to perform a program operation or an erase operation for memory cells, a pulse of high voltage is applied to the gates of the memory cells several times. A potential difference occurs and charges move in the memory cells in response to the applying of the pulse, and thus the threshold voltages of the memory cells are shifted to store the corresponding data therein. With the development of relevant technology, progressively increasing number of memory cells are provided in the nonvolatile memory device. In order to obtain a desired threshold voltage distribution of the memory cells, high voltage is to be applied to the gates of the memory cells in various ways. Accordingly, the physical properties of the memory cells may deteriorate, and the operation time, the operating current, or the consumption of current may be increased.

BRIEF SUMMARY

According to exemplary embodiments, efficiency in the operation of a memory device can be increased and the operation time or the operating current can be reduced by skipping a verification operation in a program operation or an erase operation.

A method of operating a nonvolatile memory device according to an aspect of the present disclosure includes performing a first program loop, including a first program operation and a first program verification operation, for the memory cells of a first page, counting a number of times that the first program loop is performed and storing the counted number when a memory cell having a threshold voltage higher than a first verification voltage, among the memory cells of the first page, is detected, applying a single program pulse, having a voltage level stepwise rising by the stored number of first program loops, to memory cells of a second page, and performing a second program loop, including a second program operation and a second program verification operation, for memory cells of a second page in response to the stored number for the first program loop.

A method of operating a nonvolatile memory device according to another aspect of the present disclosure includes performing a program operation with an incremental step pulse programming (ISPP) for memory cells of a first page, counting the number of times that a program pulse is applied and storing the counted number when a program verification operation is passed, applying a single program pulse, having a voltage level stepwise rising by the stored number of the program pulse, to memory cells of a second page, performing a program operation with the incremental step pulse programming (ISPP) for memory cells of a second page.

A method of operating a nonvolatile memory device according to still another aspect of the present disclosure includes performing a first erase loop, including a first erase operation and a first erase verification operation, for the memory cells of a first memory cell block, counting a number of times that the first erase loop is performed and storing the counted number when a memory cell having a threshold voltage lower than a first erase verification voltage, among the memory cells of the first memory cell block, is detected, and applying a single erase pulse, having a stepwise voltage level which rises in steps for a number of times equal to the stored number, to the memory cells of a second memory cell block.

A nonvolatile memory device according to still another aspect of the present disclosure includes a plurality of pages each configured to include a plurality of memory cells, an operation circuit group configured to perform first and second program loops, each including a program operation and a program verification operation, for first and second pages of the pages, and a control circuit configured to control the operation circuit group to store a number of times that the first program loop is performed until a memory cell, having a threshold voltage higher than a first verification voltage, is detected among memory cells of the first page and to perform the program operation of the second program loop by applying a single program pulse, having a stepwise voltage level which rises in steps for a number of times equal to the stored number of times, to memory cells of the second page.

A nonvolatile memory device according to still another aspect of this disclosure includes a plurality of memory cell blocks each configured to include a plurality of memory cells, an operation circuit group configured to perform first and second erase loops, each including an erase operation and an erase verification operation, and first and second soft program loops, each including a soft program operation and a soft program verification operation, for first and second memory cell blocks, and a control circuit configured to control the operation circuit group to store a number of times that the first erase loop is performed until a memory cell having a threshold voltage lower than a first erase voltage, is detected among memory cells of the first memory cell block and to perform the erase operation of the second erase loop by applying a single erase pulse, having a stepwise voltage level which rises in steps for a number of times equal to the stored number of times, to memory cells of the second memory cell block.

A nonvolatile memory device according to still another aspect of the present disclosure includes a controller configured to generate a program command signal, a peripheral circuit configured to perform a program operation for memory cells with an incremental step pulse programming (ISPP) in response to the program command signal, a register configured to store the number of times that a program pulse is applied when a program verification operation is passed, wherein the peripheral circuit applies a single program pulse, having a voltage level stepwise rising by the stored number of the program pulse.

BRIEF DESCRIPTION OF THE DRAWINGS

FIGS. 2A and 2B are diagrams illustrating program operations and program verification operations for the nonvolatile memory device according to an exemplary embodiment of this disclosure;

DESCRIPTION OF EMBODIMENTS

Hereinafter, some exemplary embodiments of the present disclosure will be described in detail with reference to the accompanying drawings. The figures are provided to enable those of ordinary skill in the art to make and use the embodiments of the disclosure.

Nonvolatile Memory Device

Figure 1:
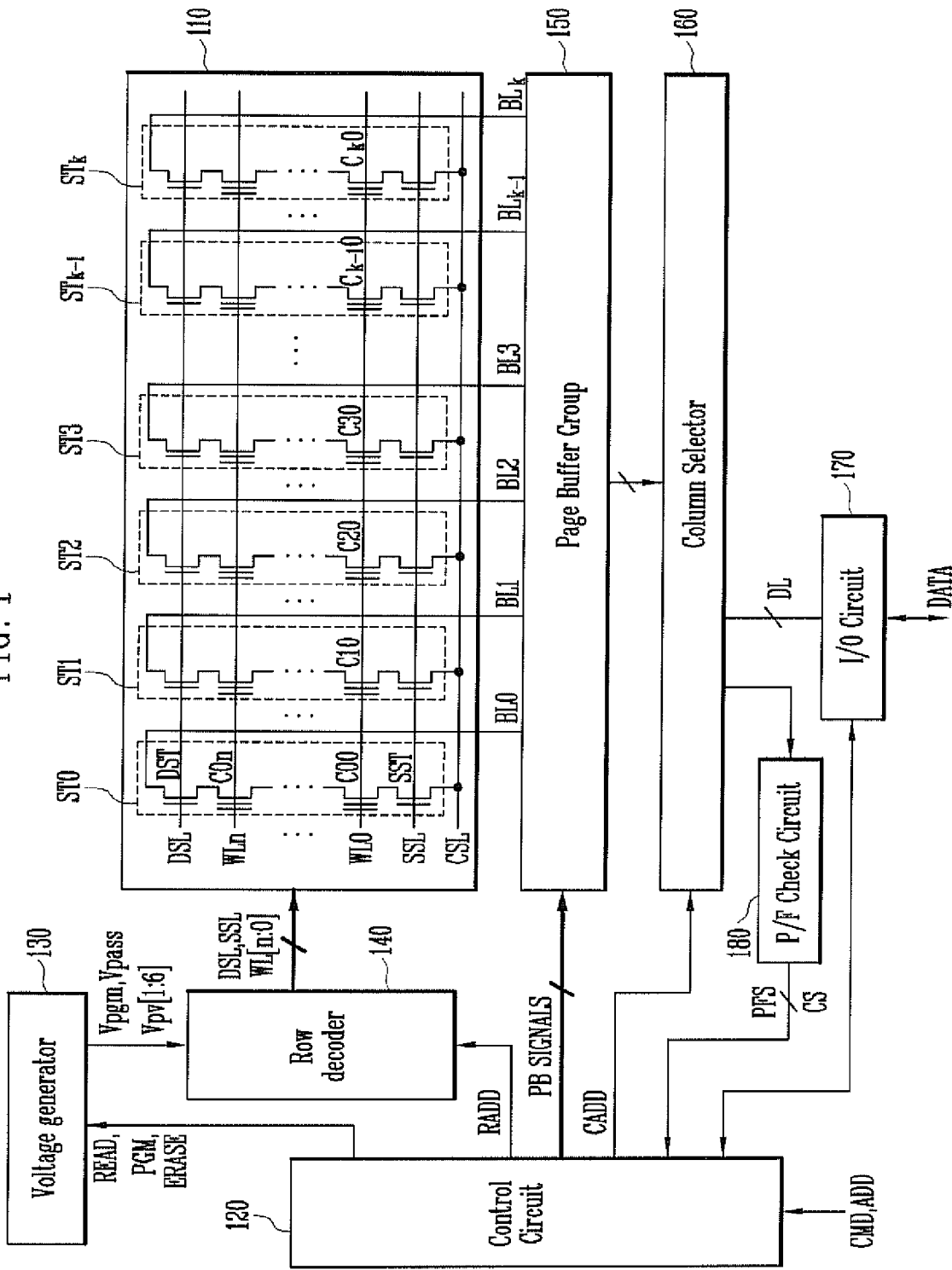
FIG. 1 is a block diagram showing a nonvolatile memory device according to an exemplary embodiment of this disclosure.

FIG. 1 is a block diagram showing a nonvolatile memory device according to an exemplary embodiment of this disclosure.

Referring to FIG. 1, the nonvolatile memory device according to the exemplary embodiment of this disclosure includes a memory cell block 110 included in a memory cell array, an operation circuit group (130, 140, 150, 160, 170, and 180) configured to perform a program operation, a program verification operation, an erase operation, and an erase verification operation for the memory cells of the memory cell block 110, and a control circuit 120 configured to control the operation circuit group (130, 140, 150, 160, 170, and 180).

In a NAND flash memory device, the operation circuit group may include a voltage generator 130, a row decoder 140, a page buffer group 150, a column selector 160, an I/O circuit 170, and a pass/fail (P/F) check circuit 180.

The memory cell array may include a plurality of the memory cell blocks. FIG. 1 shows only one memory cell block 110 of the memory cell blocks for convenience. The memory cell block 110 includes a plurality of strings ST0 to STk. Each of the strings, for example, ST0, includes a source select transistor SST coupled to a common source line CSL, a plurality of memory cells C00 to C0n, and a drain select transistor DST coupled to a bit line BL0. The gate of the source select transistor SST is coupled to a source select line SSL. The gates of the memory cells C00 to C0n are coupled to respective word lines WL0 to WLn. The gate of the drain select transistor DST is coupled to a drain select line DSL. The strings ST0 to STk are coupled to the respective bit lines BL0 to BLk and in common coupled to the common source line CSL.

The control circuit 120 internally generates a program operation signal PGM, a read operation signal READ, or an erase operation signal ERASE in response to a command signal CMD and generates control signals PB SIGNALS for controlling the page buffers (not shown) of the page buffer group 150 based on a type of the operation. Furthermore, the control circuit 120 internally generates a row address signal RADD and a column address signal CADD in response to an address signal ADD. In this disclosure, the control circuit 120 controls the operation circuit group (130, 140, 150, 160, 170, and 180) such that a program operation, a program verification operation, an erase operation, and an erase verification operation can be performed. If a programmed or erased memory cell is not detected when the program operation or the erase operation is performed, the control circuit 120 controls the operation circuit group (130, 140, 150, 160, 170, and 180) such that the program or erase verification operation is selectively performed. This is described in detail later.

The voltage supply circuit (130 and 140) supplies operation voltages for the program operation, the erase operation, or the read operation of memory cells to the drain select line DSL, the word lines WL0 to WLn, and the source select line SSL of the selected memory cell block 110 in response to the signals READ, PGM, ERASE, and RADD of the control circuit 120. The voltage supply circuit includes the voltage generator 130 and the row decoder 140. The voltage supply circuit (130 and 140) supplies a program voltage or an erase voltage for the program or erase operation of the word lines WL0 to WLn.

The voltage generator 130 outputs the operation voltages for programming or erasing memory cells to the global lines in response to the signals PGM, READ, and ERASE of the control circuit 120 (that is, the internal command signals). For example, the voltage generator 130 outputs operation voltages Vpgm and Vpass to the global lines when memory cells are programmed. Furthermore, the voltage generator 130 may output relevant operation voltages when memory cells are erased.

The row decoder 140 transfers the operation voltages of the voltage generator 130 to the strings ST1 to STk of the selected memory cell block 110 in response to the row address signal RADD of the control circuit 120.

The page buffer group 150 includes the page buffers (not shown) coupled to the respective bit lines BL0 to BLk. The page buffer group 150 supplies voltages necessary to store data in the memory cells C00 to Ck0 to the respective bit lines BL0 to BLk in response to the control signals PB SIGNALS of the control circuit 120.

The column selector 160 selects the page buffers of the page buffer group 150 in response to the column address signal CADD of the control circuit 120. Data latched in a page buffer selected by the column selector 160 is outputted.

The I/O circuit 170 transfers external data, inputted in a program operation, to the column selector 160 under the control of the control circuit 120 in order to input the data to the page buffer group 150.

The P/F check circuit 180, after the program operation, checks whether there is an error cell having a threshold voltage lower than a target voltage among programmed memory cells, through a program verification operation, and outputs a result of the check as a check signal PFC. Furthermore, the P/F check circuit 180, after the erase operation, checks whether there is an error cell having a threshold voltage higher than a target voltage among erased memory cells, through an erase verification operation. Meanwhile, the P/F check circuit 180 counts the number of error cells and outputs a result of the count as a count signal CS.

A program loop, including a program operation and a program verification operation, according to an exemplary embodiment of this disclosure is described in detail as follows.

Program Loop

Figure 2B:
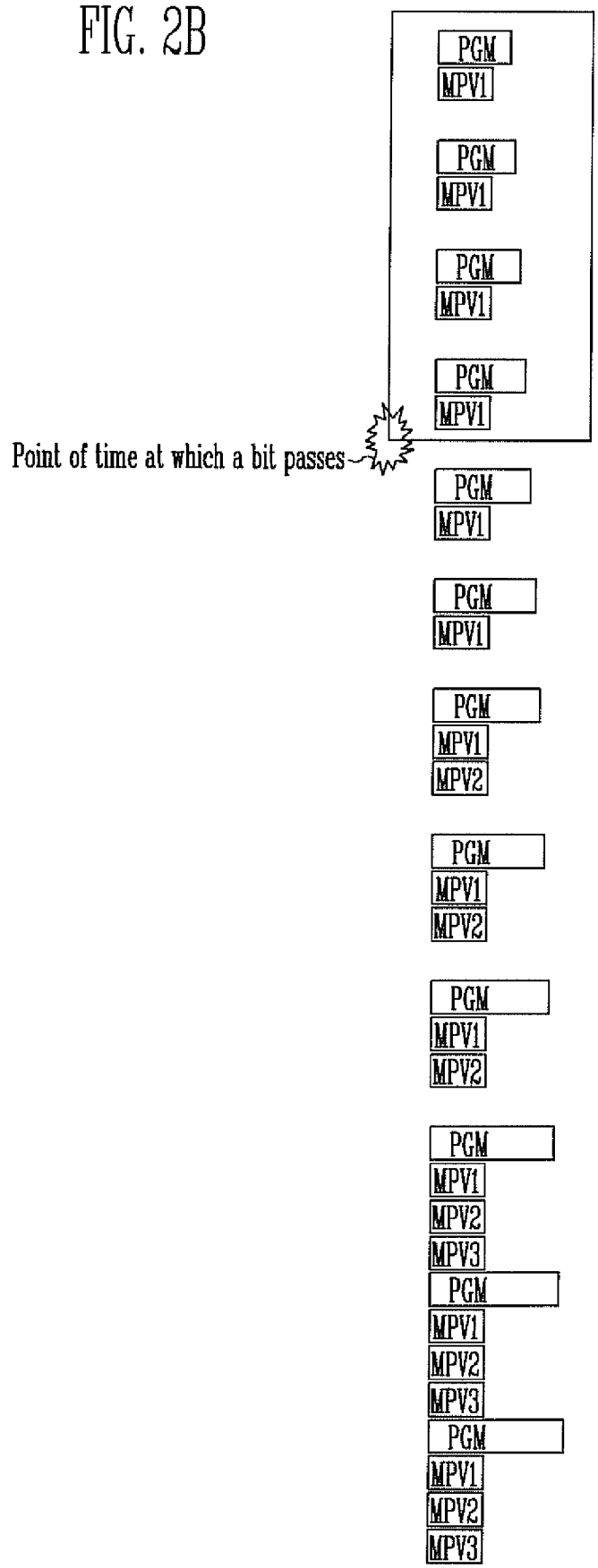
Figure 2C:
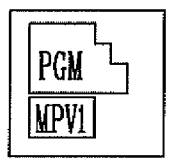
FIGS. 2C to 2E are diagrams illustrating program operations and program verification operations for the nonvolatile memory device according to another exemplary embodiment of this disclosure.
Figure 2C:
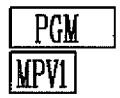
Figure 2C:
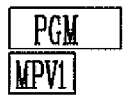
Figure 2C:
Figure 2C:
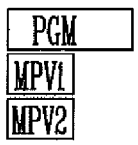
Figure 2C:
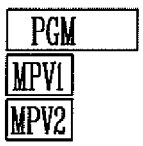
Figure 2C:
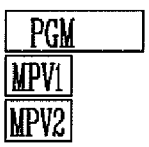
Figure 2C:
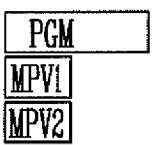
Figure 2C:
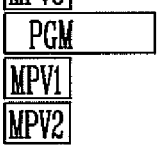
Figure 2C:
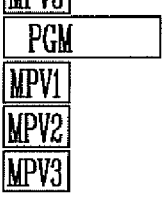

FIGS. 2A to 2C are diagrams illustrating program operations and program verification operations for the memory cells of the nonvolatile memory device according to an exemplary embodiment of this disclosure.

The program loop for the nonvolatile memory device includes the program operation for applying program pulses and the program verification operation for checking whether memory cells, which are read in a read operation, have been programmed with a reference verification voltage or higher. In a single level cell (hereinafter referred to as an 'SLC') program method, one reference verification voltage may be used because memory cells are in two different states. In a multi-level cell (hereinafter referred to as an 'MLC') program method, however, a plurality of reference verification voltages may be used because memory cells with several states exist in one page. For example, in a 2-bit MLC program method, two different cell distributions are generated by a least significant bit (hereinafter referred to as an 'LSB') program operation and four states of memory cells with different threshold voltages result from a most significant bit (hereinafter referred to as an 'MSB') program operation.

In the program verification operation, different verification voltages are to be used for the four states of memory cells. In other words, it is verified which one of the four states a memory cell belongs to by using a first verification voltage, a second verification voltage, and a third verification voltage.

Accordingly, in an incremental step pulse program (hereinafter referred to as an 'ISPP') method, a total of three program verification operations may be performed after one program voltage is supplied.

FIG. 2A shows program pulses and program verification voltages which are applied when program operations and program verification operations are performed according to an exemplary embodiment.

Referring to FIG. 2A, after a first program pulse PGM is applied, a program verification operation is performed based on a first verification voltage MPV1. In principle, program verification operations based on a second verification voltage and a third verification voltage may be performed for a memory cell of an MLC. In the early stage, however, since there is a very low possibility that the memory cell would have been programmed to have a level of the second verification voltage or higher, only the verification operation based on the first verification voltage MPV1 is performed.

The program operation and the program verification operation based on the first verification voltage MPV1 are performed by a predetermined number of times. Thereafter, after a program operation, a program verification operation based on not only the first verification voltage MPV1, but also the second verification voltage MPV2 is performed. This process is also performed by a predetermined number of times. Thereafter, after a program operation, a program verification operation based on not only the first verification voltage MPV1 and the second verification voltage MPV2, but also a third verification voltage MPV3 is performed.

Since the program operation may be performed according to the ISPP method, the amount/amplitude of the applied program pulse PGM may be gradually increased with an increase of the number of times for the program operations to be performed.

FIG. 2B shows program pulses and program verification voltages applied when program operations and program verification operations of a smart blind method are performed.

Referring to FIG. 2B, in the smart blind method, a program operation and a program verification operation based on a first verification voltage MPV1 are repeated until a memory cell programmed to have the level of the first verification voltage MPV1 or higher is detected. In other words, the program operation and the program verification operation based on the first verification voltage MPV1 are not performed by a predetermined number of times, but performed only until a memory cell having a varied state is detected. In this case, the program operations and program verification operations based on only the first verification voltage MPV1 can be performed an optimized/minimized number of times.

In this case, the amount of the applied program pulse PGM is gradually increased with an increase of the number of times for program operations and program verification operations to be performed.

Figure 3:
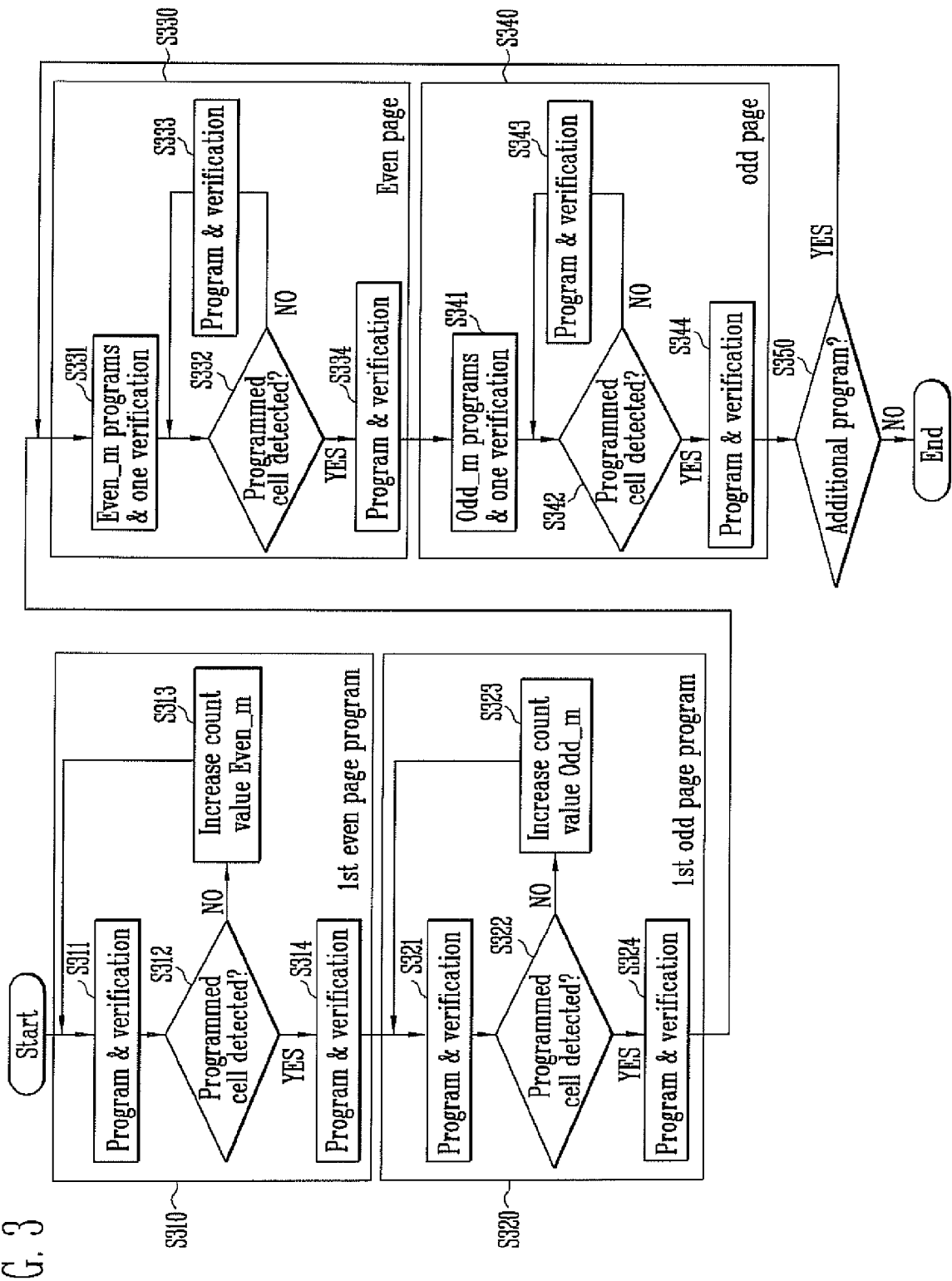
FIG. 3 is a flowchart illustrating program operations and program verification operations for the nonvolatile memory device according to an exemplary embodiment of this disclosure.

FIG. 2C shows program pulses and program verification voltages applied when program operations and program verification operations are performed according to another exemplary embodiment of this disclosure. Meanwhile, FIG. 3 is a flowchart illustrating program operations and program verification operation according to an exemplary embodiment of this disclosure.

Referring to FIG. 2C, after a program pulse having a stepwise voltage level, i.e., gradually rising in steps, is applied, a verification operation is performed. Since the stepwise program pulse is applied, there is such an effect as a program verification operation is performed after a program voltage is supplied two or more times. A program loop, including program operations and program verification operations, according to this disclosure is described with reference to FIGS. 2C and 3 as follows.

The memory device includes pages each of which is the basic unit of a program operation. For example, memory cells coupled to one word line (for example, refer to WL0 of FIG. 1) may form one page. Furthermore, even-numbered memory cells among the memory cells coupled to one word line (for example, WL0) may form one even page and the other odd-numbered memory cells may form one odd page.

The program operation and the program verification operation are performed on the basis of the page. The method described with reference to FIG. 2B may be applied to the even page and the odd page on which the program loop is first performed.

Referring to FIGS. 1 and 3, after the program loop for a first even page, including the even-numbered memory cells C00 to $C_{k-1}0$ of the first word line WL0, is first performed at step S310, the program loop for a first odd page, including the odd-numbered memory cells C10 to $C_k0$ of the first word line WL0, may be performed at step S320. The program loops for the first even page and the first odd page may be performed by the same process. First, the program operation for applying a program pulse and the program verification operation based on the first verification voltage MPV1 is performed at steps S311 and S321.

It is then determined at steps S312 and S322 whether a memory cell programmed to have the level of the first verification voltage MPV1 or higher is detected. If such a memory cell is not detected, count values Even_m and Odd_m are increased by 1 at steps S313 and S323, and the program operation and the program verification operation based on the first verification voltage MPV1 are then performed again at steps S311 and S321. Here, each of the count values may have an initial value of 1, and the program pulse may rise in steps by a step voltage at each step whenever the program operation is repeated. Filially, the count values Even_m and Odd_m may indicate the number of program operations and program verification operations performed until a memory cell programmed to have the level of the first verification voltage MPV1 or higher is detected.

If, through the above processes, it is determined at steps S312 and S322 that a memory cell programmed to have the level of the first verification voltage MPV1 or higher has been detected, the program operation and the program verification operation are performed by another method at steps S314 and S324. At steps S314 and S324, the program verification operation based on the first verification voltage MPV1 and a second verification voltage MPV2, together with the program operation, is repeated for a predetermined number of times. Thereafter, a program verification operation may be performed based on the first verification voltage MPV1, the second verification voltage MPV2, and a third verification voltage MPV3 by a predetermined number of times. Meanwhile, in the case where an SLC program operation is performed, after the program operation, only the program verification operation based on the first verification voltage MPV1 may be repeated for a predetermined number of times. Furthermore, in the SLC program operation, if it is determined at steps S312 and S322 that a memory cell programmed to have the level of the first verification voltage MPV1 or higher has been detected, the program loop is terminated, and steps S314 and S324 may be omitted.

If it is determined at steps S312 and S322 that a memory cell programmed to have the level of the first verification voltage MPV1 or higher has been detected, count values Even_m and Odd_m at that time are stored at steps S314 and S324. The values may be stored in places, such as the registers of the control circuit.

After the program loop for the first even page and the program loop for the first odd page are completed in this manner, program loops for a second even page and a second odd page are performed. The program loops for the second even page and the second odd page may also be performed in such a way that the program loop for the even page is performed at step S330 and then the program loop for the odd page is performed at step S340.

The program loops for the second even page and the second odd page may be performed by the same process. First, a program pulse for the program operation is applied, and the program verification operation based on the first verification voltage MPV1 is performed. Here, after the program operation is continuously performed for the number of times corresponding to the count values Even_m and Odd_m stored in the register, the program verification operation is performed at steps S331 and S341. After the program operation and the program verification operation were repeated for the number of times corresponding to the finally stored count values Even_m and Odd_m, a memory cell programmed to have the level of the first verification voltage MPV1 or higher was detected at the program loops for the first even and odd pages. Thus, after the program operation is continuously performed for the number of times corresponding to the count value Even_m, Odd_m without the program verification operation, the program verification operation is performed once. That is, the number of program verification operations corresponding to a value smaller than the stored count values Even_m and Odd_m by 1 may be omitted. If the program verification operation is omitted for a number of times, the program pulse may be continuously applied for equal number of times. Here, the program pulses may be continuously applied as a continuous pulse.

Figure 2D:
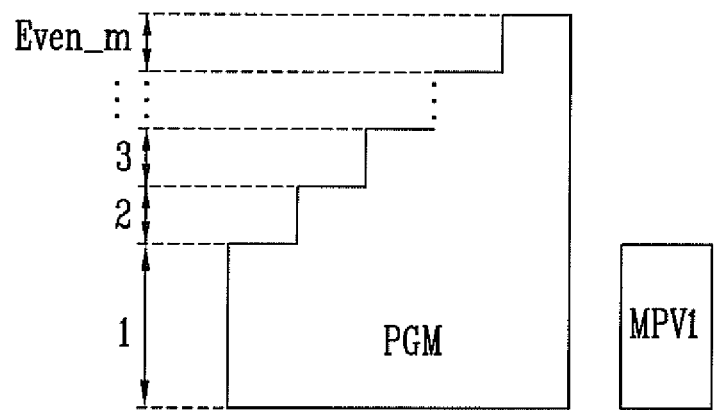
Figure 2E:
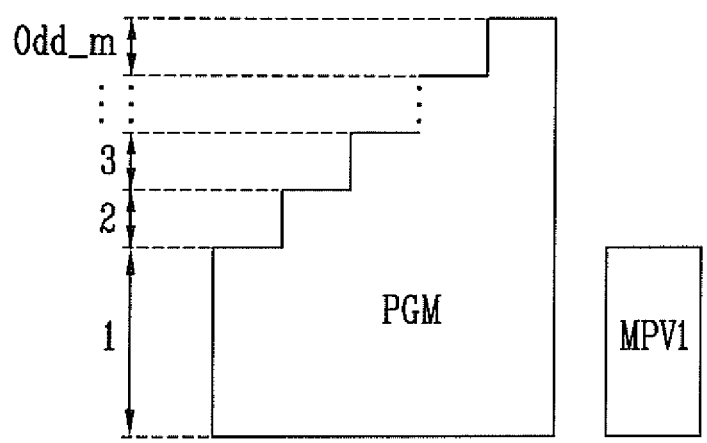

FIG. 2C shows an example in which the continuous program pulses are applied in the form of a single pulse, and FIGS. 2D and 2E show examples of the program pulses applied at steps S331 and S341, respectively.

Referring to FIGS. 2C to 2E, in the ISPP method, the amount of a program pulse is continuously increased whenever the program operation is performed. Accordingly, a single stepwise pulse may be applied as the program pulses applied continuously. The amount/amplitude of the stepwise pulse may be continuously increased in steps by a step voltage corresponding to the count values Even_m and Odd_m stored in the register.

After the program operation is performed by above processes, the program verification operation based on the first verification voltage MPV1 is performed. In this case, a program verification operation may be omitted when there is less possibility that a memory cell programmed to have the level of the first verification voltage MPV1 or higher exist. Accordingly, the program loop can be efficiently performed.

It is then determined at steps S332 and S342 whether a memory cell programmed to have the level of the first verification voltage MPV1 or higher is detected. If it is determined that a memory cell programmed to have the level of the first verification voltage MPV1 or higher has not been detected, the program operation and the program verification operation are performed again at steps S333 and S343. Meanwhile, if it is determined that a memory cell programmed to have the level of the first verification voltage MPV1 or higher has been detected, the program operation and the program verification operation are repeatedly performed by another method at steps S334 and S344. That is, the program operation and the program verification operation based on the first verification voltage MPV1 and a second verification voltage MPV2 are repeatedly performed by a predetermined number of times at steps S334 and S334. Thereafter, a program verification operation may be performed based on the first verification voltage MPV1, the second verification voltage MPV2, and a third verification voltage MPV3 by a predetermined number of times. In the case of an SLC program method, without the steps S332 and S342 of determining whether a memory cell programmed to have the level of the first verification voltage MPV1 or higher has been detected, the program operations and the verification operation based on the first verification voltage MPV1 may be performed at the steps S334 and S344 for a predetermined number of times. The steps S334 and S344 may be omitted, if appropriate.

After the program loop for the second odd and even pages is completed, it is determined at a step S350 whether an additional program loop for other pages is to be performed. If, as a result of the determination, the additional program loop is to be performed, the above-described processes may be repeatedly performed.

A method of increasing the efficiency of the entire program loop by decreasing the number of program verification operations to be performed has been described above. An erase operation and an erase verification operation may be performed according to the same principle as above.

An erase loop according to an exemplary embodiment of this disclosure is described as follows.

Erase Loop

Figure 4:
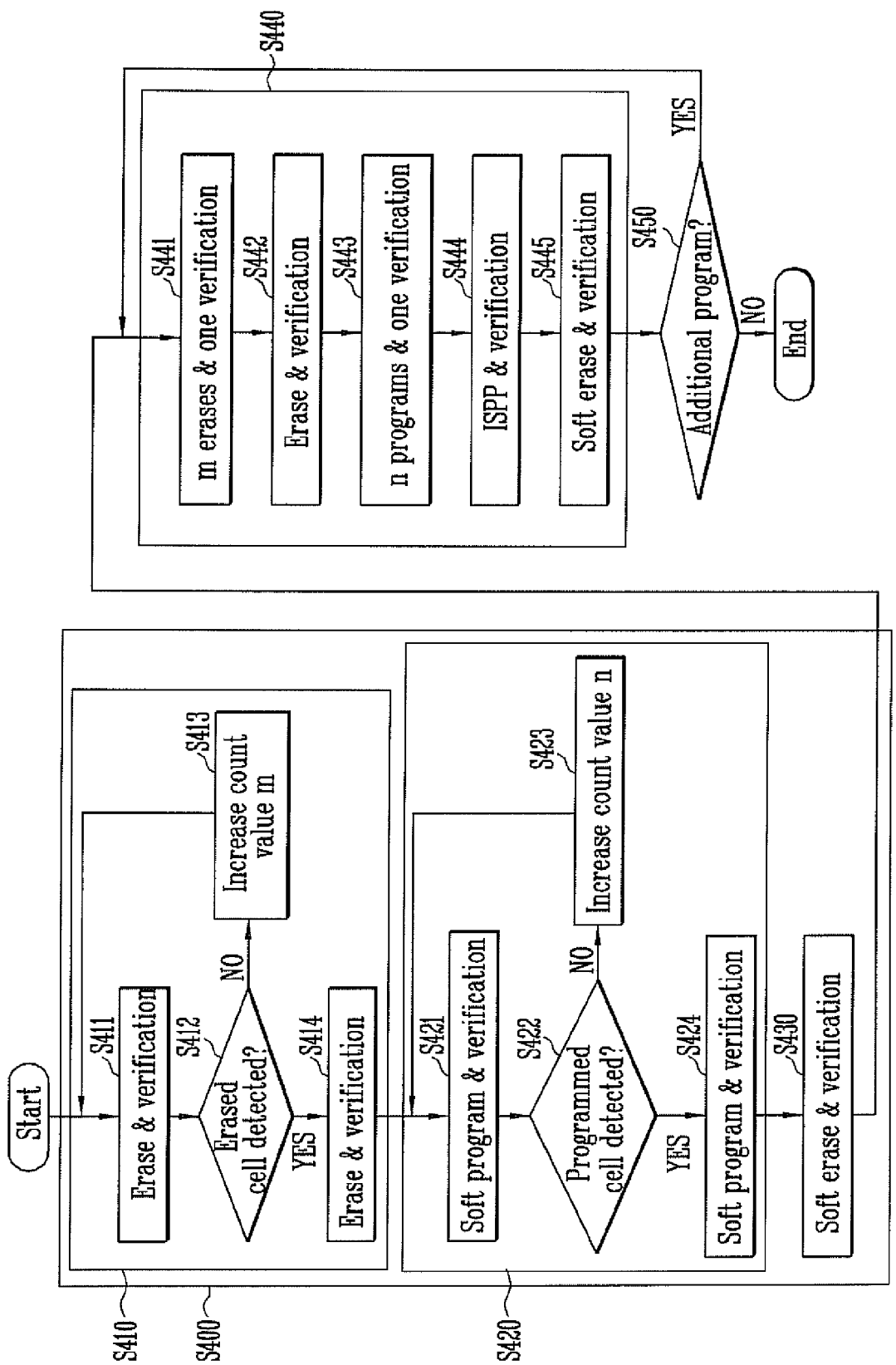
FIG. 4 is a flowchart illustrating erase operations and erase verification operations for the nonvolatile memory device according to an exemplary embodiment of this disclosure.

FIG. 4 is a flowchart illustrating erase operations and erase verification operations for the nonvolatile memory device according to an exemplary embodiment of this disclosure.

The erase operation is performed on the basis of a memory cell block.

Referring to FIG. 4, after an erase loop for a first memory cell block is performed at step S400, an erase loop for a second memory cell block may be performed at step S440.

The erase loop for the first memory cell block includes an incremental step pulse erase (hereinafter referred to as an 'ISPE') loop (S410), an ISPP loop (S420), and a soft erase loop (S430) which are sequentially performed.

The ISPE loop (S410) is performed as follows. First, an erase operation is performed by applying a ground voltage to the word lines of the first memory cell block and an erase pulse to a well, and an erase verification operation for the erase operation is performed at step S411. Here, the erase operation is also called a hard erase operation because the amount/amplitude of the erase pulse is very low. It is then determined at step S412 whether a memory cell, having a threshold voltage equal to or lower than the erase verification voltage, has been detected. If it is determined that a memory cell, having a threshold voltage equal to or lower than the erase verification voltage, has not been detected, a count value 'm' is increased by 1 at step S413, and the erase operation and the erase verification operation are performed again at step S411. The count value 'm' has an initial value of 1. The count value 'm' may finally indicate the number of erase operations and erase verification operations performed until a memory cell, having a threshold voltage equal to or lower than an erase verification voltage, is detected.

If, through the above processes, it is determined at step S412 that a memory cell, having a threshold voltage equal to or lower than the erase verification voltage, has been detected, the count value 'm' is stored, and the erase operation and the erase verification operation are performed by another method at step S414. At step S414, the erase operation and the erase verification operation may be repeatedly performed until the threshold voltages of all the memory cells become the erase verification voltage or less. This process may be omitted, if appropriate. Since the above erase loop is the ISPE loop, the amount of the applied erase pulse may be gradually increased whenever the erase operation is performed.

After the ISPE loop is completed, the ISPP loop is performed at step S420. The ISPP loop is performed in order to raise the threshold voltages of memory cells, which have lowered excessively as a result of the ISPE loop, to some extent. First, a soft program operation and a relevant verification operation are performed at step S421. It is then determined at step S422 whether a memory cell programmed to have the level of a first reference voltage or higher has been detected. If it is determined at step S422 that a memory cell programmed to have the level of a first reference voltage or higher has not been detected, a count value 'n' is increased by 1 at step S423, and the soft program operation and the program verification operation are performed again at step S421. The count value 'n' may have an initial value of 1. The count value 'n' may finally indicate the number of soft program operations and program verification operations performed until a memory cell programmed to have the level of the first reference voltage or higher is detected.

On the other hand, if it is determined at step S422 that a memory cell programmed to have a first reference voltage or higher has been detected, the count value 'n' is stored, and a soft program operation and a program verification operation are repeatedly performed by another method at step S424. As the ISPP loop is performed, the amount/amplitude of the program pulse applied to a word line may be gradually increased whenever the program operation is repeated. The step S424 may be omitted, if appropriate.

After the ISPP loop is completed, the soft erase loop may be performed at step S430. The soft erase loop may be selectively performed in order to narrow the entire width of threshold voltage distributions of memory cells by lowering the threshold voltages of the memory cells which have been increased excessively as a result of the ISPP loop. The soft erase loop may also be performed by applying a specific erase voltage to a word line coupled to relevant memory cells and then repeatedly performing a relevant erase verification operation. This loop is also called a soft erase verifying (SEV) loop because a soft erase operation and a relevant erase verification operation are repeatedly performed.

After the ISPE loop (S410), the ISPP loop (S420), and the soft erase loop (S430) for the first memory cell block are completed, the erase loop for the second memory cell block may be performed at step S440.

First, after an ISPE operation without an erase verification operation is performed m times with reference to the count value 'm' stored at step S410, an erase verification operation is performed once at step S441. In other words, m number of ISPP operations and an erase verification operation are performed, and (m−1) number of erase verification operations may be omitted. If the erase verification operations are omitted for a number of times, the erase pulses may be continuously applied for equal number of times. The erase pulses may be continuously applied in the form of a single pulse. In the ISPE method, the amount of the erase pulse is continuously increased whenever the erase operation is performed. Accordingly, a single stepwise pulse may be applied as the erase pulses applied continuously. In this case, the entire erase coop can be efficiently performed by omitting an erase verification operation when there is less possibility that a memory cell, having a threshold voltage equal to or lower than the erase verification voltage, may exist. After the $m^{th}$ ISPE operation, an ISPE operation and an erase verification operation may be normally repeated at step S442. This process may be omitted, if appropriate.

Next, after n number of ISPP operations without a relevant verification operation are continuously performed with reference to the count value 'n' stored at step S420, a program verification operation is performed once at step S443. That is, n number of the ISPP operations and the program verification operation are performed and (n−1) number of program verification operations may be omitted. If the program verification operations are omitted for a number of times, the program pulses may be continuously applied for equal number of times. Here, the program pulses may be continuously applied in the form of a single pulse. In this case, a program verification operation may be omitted when there is less possibility that a memory cell programmed to have the level of the verification voltage or higher may exist. After the $n^{th}$ ISPP operation, an ISPP operation and a program verification operation may be normally repeated at step S444. The step S444 may be omitted, if appropriate.

After the ISPP operation, a soft erase operation and an erase verification operation for the second memory cell block are performed at step S445 as in the erase loop for the first memory cell block.

After the erase loop for the second memory cell block is completed through the above process, it is checked at step S450 whether there is an additional memory cell block on which an erase loop is to be performed. If, as a result of the determination, an additional memory cell block is determined to exist, the steps S441 to S445 for the additional memory cell block are repeatedly performed. If, as a result of the determination, an additional memory cell block is determined not to exist, the erase loop is terminated.

According to the embodiments of this disclosure, a verification operation may be omitted when a memory cell has not programmed or erased yet in a program operation or an erase operation, e.g., at the early stage of the program or erase operation. Accordingly, efficiency in the operation of a memory device can be increased, and the operation time or the operating current can be reduced.

What is claimed is:
1. A method of operating a nonvolatile memory device, the method comprising:
   performing a first program loop, including a first program operation and a first program verification operation, for memory cells of a first page;
   counting a number of times that the first program loop is performed and storing the counted number when a memory cell having a threshold voltage higher than a first verification voltage, among the memory cells of the first page, is detected; and applying a single program pulse, having a voltage level stepwise rising by the stored number of first program loops, to memory cells of a second page; and performing a second program loop, including a second program operation and a second program verification operation, for the memory cells of the second page in response to the stored number for the first program loop.

2. The method of claim 1, wherein the first page is a first even page or a first odd page of pages which are to be programmed.

3. The method of claim 1, further comprising performing a program verification operation based on the first verification voltage for the memory cells of the second page, after applying the single program pulse to the memory cells of the second page.

4. The method of claim 1, further comprising performing a program operation and a program verification operation based on a second verification voltage, and a program operation and a program verification operation based on a third verification voltage for the memory cells of the first page, after storing the number of first program loops.

5. The method of claim 1, wherein repeatedly performing the second program loop comprises performing a program operation and a program verification operation based on a second verification voltage, and a program operation and a program verification operation based on a third verification voltage for the memory cells of the second page.

6. A method of operating a nonvolatile memory device, the method comprising:

performing a first erase loop, including a first erase operation and a first erase verification operation, for memory cells of a first memory cell block;

counting a number of times that the first erase loop is performed and storing the counted number when a memory cell having a threshold voltage lower than a first erase verification voltage, among the memory cells of the first memory cell block, is detected; and applying a single erase pulse, having a stepwise voltage level which rises in steps for a number of times equal to the stored number of times, to memory cells of a second memory cell block.

7. The method of claim 6, further comprising performing a second erase verification operation based on the first erase verification voltage for the memory cells of the second memory cell block, after the applying of the single erase pulse to the memory cells of the second memory cell block.

8. The method of claim 6, further comprising repeatedly performing a second erase loop, including a second erase operation and a second erase verification operation, for the memory cells of the second memory cell block, after the applying of the single erase pulse to the memory cells of the second memory cell block.

9. The method of claim 6, further comprising:

repeatedly performing a first soft program loop, including a first soft program operation and a first soft program verification operation, for the first memory cell block; and counting a number of times that the first soft program loop is performed and storing the counted number when a memory cell having a threshold voltage higher than a first soft program verification voltage, among the memory cells of the first memory cell block, is detected; and applying a single program pulse, having a stepwise voltage level which rises in steps for a number of times equal to the stored number of times, to the memory cells of the second memory cell block.

10. The method of claim 9, further comprising performing a second soft program verification operation based on the first soft program verification voltage for the memory cells of the second memory cell block, after the applying of the single program pulse to the memory cells of the second memory cell block.

11. The method of claim 9, further comprising repeatedly performing a second soft program loop, including a second soft program operation and a second soft program verification operation, for the memory cells of the second memory cell block, after the applying of the single program pulse to the memory cells of the second memory cell block.

12. A nonvolatile memory device, comprising:

a plurality of pages each configured to include a plurality of memory cells;

an operation circuit group configured to perform first and second program loops, each including a program operation and a program verification operation, for first and second pages of the pages; and a control circuit configured to control the operation circuit group to store a number of times that the first program loop is performed until a memory cell, having a threshold voltage higher than a first verification voltage, is detected among memory cells of the first page and to perform the program operation of the second program loop by applying a single program pulse, having a stepwise voltage level which rises in steps for a number of times equal to the stored number of times, to memory cells of the second page.

13. The nonvolatile memory device of claim 12, wherein the control circuit controls the operation circuit group such that the program verification operation based on the first verification voltage is further performed for the memory cells of the second page.

14. The nonvolatile memory device of claim 12, wherein the control circuit controls the operation circuit group such that a program operation and a verification operation based on a second verification voltage, and a program operation and a verification operation based on a third verification voltage are further performed for the memory cells of the first page.

15. The nonvolatile memory device of claim 12, wherein the control circuit controls the operation circuit group such that a program operation and a verification operation based on a second verification voltage, and a program operation and a verification operation based on a third verification voltage are further performed for the memory cells of the second page.

16. A nonvolatile memory device, comprising:

a plurality of memory cell blocks each configured to include a plurality of memory cells;

an operation circuit group configured to perform first and second erase loops, each including an erase operation and an erase verification operation, and first and second soft program loops, each including a soft program operation and a soft program verification operation, for first and second memory cell blocks; and a control circuit configured to control the operation circuit group to store a number of times that the first erase loop is performed until a memory cell having a threshold voltage lower than a first erase voltage is detected among memory cells of the first memory cell block and to perform the erase operation of the second erase loop by applying a single erase pulse, having a stepwise voltage level which rises in steps for a number of times equal to the stored number of times, to memory cells of the second memory cell block.

17. The nonvolatile memory device of claim 16, wherein the control circuit controls the operation circuit group such that an erase verification operation based on the first erase verification voltage is further performed for the memory cells of the second memory cell block.

18. The nonvolatile memory device of claim 16, wherein the control circuit controls the operation circuit group such that the second erase loop, including an erase operation and an erase verification operation, is repeatedly performed for the memory cells of the second memory cell block.

19. The nonvolatile memory device of claim 16, wherein the control circuit is configured to control the operation circuit group to store a number of times that the first soft program loop is performed until a memory cell, having a threshold voltage higher than a first soft program verification voltage, is detected among the memory cells of the first memory cell block and to perform the soft program operation of the second soft program loop by applying a single program pulse, having a stepwise voltage level which rises in steps for a number of times equal to the stored number of times, to the memory cells of the second memory cell block.

20. The nonvolatile memory device of claim 19, wherein the control circuit controls the operation circuit group such that a soft program verification operation based on the first soft program verification voltage is further performed for the memory cells of the second memory cell block.

21. The nonvolatile memory device of claim 19, wherein the control circuit controls the operation circuit group such that the second soft program loop, including a soft program operation and a soft program verification operation, is repeatedly performed for the memory cells of the second memory cell block.

22. A method of operating a nonvolatile memory device, the method comprising:
performing a program operation with an incremental step pulse programming (ISPP), for memory cells of a first page;
counting the number of times that a program pulse is applied and storing the counted number when a program verification operation is passed;
applying a single program pulse, having a voltage level stepwise rising by the stored number of the program pulse, to memory cells of a second page;
performing a program operation with the incremental step pulse programming (ISPP), for memory cells of a second page.

23. The method of claim 22, further comprising performing a program verification operation for the memory cells of the second page, after applying the single program pulse to the memory cells of the second page.

24. A nonvolatile memory device, comprising:
a controller configured to generate a program command signal;
a peripheral circuit configured to perform a program operation for memory cells with an incremental step pulse programming (ISPP) in response to the program command signal;
a register configured to store the number of times that a program pulse is applied when a program verification operation is passed;
wherein the peripheral circuit applies a single program pulse, having a voltage level stepwise rising by the stored number of the program pulse.

25. The nonvolatile memory device of 24, wherein the peripheral circuit performs a program verification operation for the memory cells, after the single program pulse is applied to the memory cells.

* * * * *